US012639987B2

(12) United States Patent
Song

(10) Patent No.: US 12,639,987 B2
(45) Date of Patent: May 26, 2026

(54) BATTERY INFORMATION GUIDE DEVICE AND METHOD THEREFOR

(71) Applicants:Hyundai Motor Company, Seoul (KR); Kia Corporation, Seoul (KR)

(72) Inventor: Kyeong Soo Song, Seoul (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 421 days.

(21) Appl. No.: 18/124,716

(22) Filed: Mar. 22, 2023

(65) Prior Publication Data

US 2024/0071145 A1     Feb. 29, 2024

(30) Foreign Application Priority Data

Aug. 31, 2022    (KR) ........................ 10-2022-0110119

(51) Int. Cl.
| | |
|---|---|
| *G01R 31/00* | (2006.01) |
| *G01R 31/371* | (2019.01) |
| *G01R 31/382* | (2019.01) |
| *G07C 5/00* | (2006.01) |
| *H01M 10/42* | (2006.01) |

(52) U.S. Cl.
CPC ........... *G07C 5/004* (2013.01); *G01R 31/371* (2019.01); *G01R 31/382* (2019.01); *H01M 2010/4271* (2013.01)

(58) Field of Classification Search
CPC .... G07C 5/004; G01R 31/371; G01R 31/382; H01M 2010/4271
USPC ........................................................ 701/31.9
See application file for complete search history.

(56) References Cited

U.S. PATENT DOCUMENTS

| | | | | |
|---|---|---|---|---|
| 2017/0282744 | A1* | 10/2017 | Koo ................. | B60W 30/1886 |
| 2018/0170354 | A1* | 6/2018 | Lee ......................... | B60R 11/04 |

* cited by examiner

*Primary Examiner* — Erin M Piateski
*Assistant Examiner* — Michael T Dowling
(74) *Attorney, Agent, or Firm* — MORGAN, LEWIS & BOCKIUS LLP

(57) ABSTRACT

A battery information guide device and a method therefor include a display and at least one processor electrically connected to the display. The at least one processor is configured to display information related to a first distance to empty (DTE) on the display based on official fuel efficiency and a state of charge (SOC), receives information related to a speed limit on a road, when the at least one processor concludes that a vehicle enters the road, displays information related to a second DTE expected when the vehicle travels at the speed limit on the display, and displays information related to a third DTE determined based on an instantaneous vehicle speed of the vehicle, when a vehicle speed of the vehicle is greater than the speed limit.

20 Claims, 6 Drawing Sheets

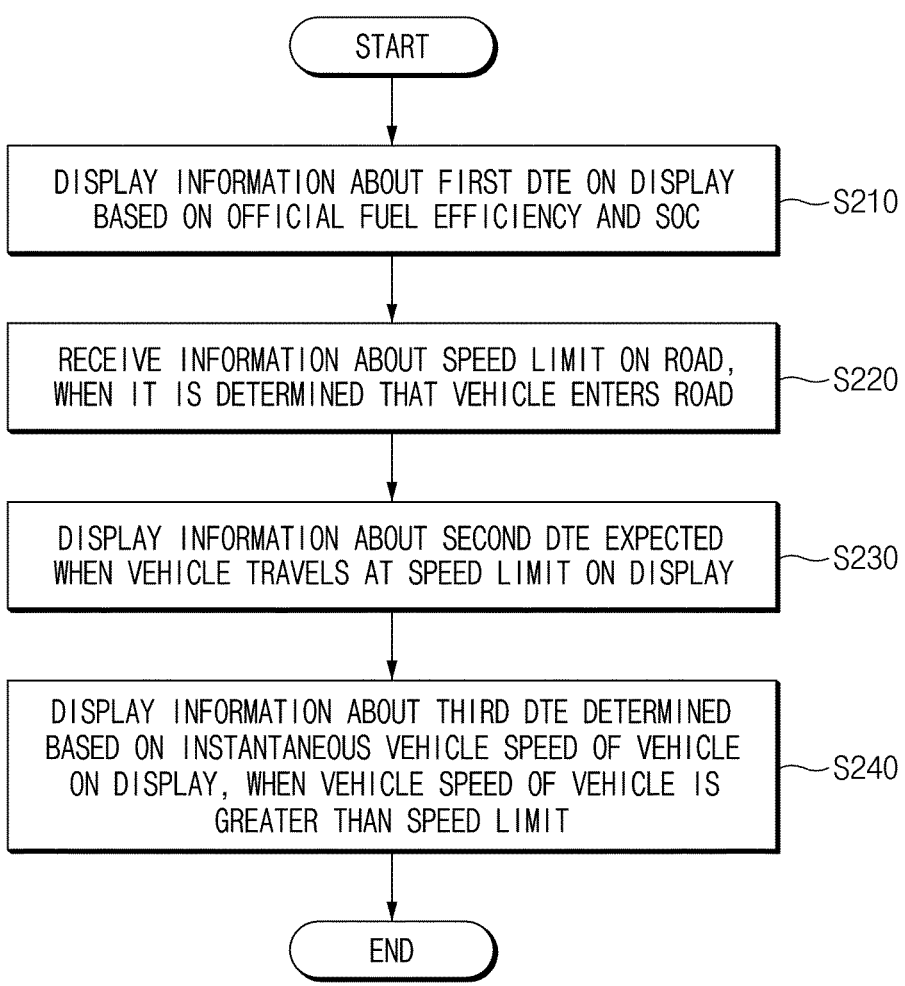

START

DISPLAY INFORMATION ABOUT FIRST DTE ON DISPLAY
BASED ON OFFICIAL FUEL EFFICIENCY AND SOC        ──S210

RECEIVE INFORMATION ABOUT SPEED LIMIT ON ROAD,
WHEN IT IS DETERMINED THAT VEHICLE ENTERS ROAD   ──S220

DISPLAY INFORMATION ABOUT SECOND DTE EXPECTED
WHEN VEHICLE TRAVELS AT SPEED LIMIT ON DISPLAY   ──S230

DISPLAY INFORMATION ABOUT THIRD DTE DETERMINED
BASED ON INSTANTANEOUS VEHICLE SPEED OF VEHICLE
ON DISPLAY, WHEN VEHICLE SPEED OF VEHICLE IS     ──S240
GREATER THAN SPEED LIMIT

END

FIG.2

| Symbol | Description | Value |
|--------|-------------|-------|
| a | Official fuel efficiency [mile/kWh] | 3.9 |
| b | SOC of high voltage battery [%] | 100 |
| c | Nominal energy of high voltage battery [kWh] | 77.8 |
| d | Reference DTE [mile] | 303 |
| e | Speed limit on road [mph] | 65 |
| f | Average vehicle speed in North American certification test highway mode [mph] | 48.2 |
| g | Fuel efficiency in North American certification test highway mode [mile/kWh] | 3.3 |
| h | High−speed limit DTE [mile] | 190 |
| i | Instantaneous high voltage battery voltage [V] | 700 |
| j | Instantaneous high voltage battery current consumption [A] | 60 |
| k | Instantaneous high voltage battery power consumption [W] | 42000 |
| l | Amount of high voltage battery power consumption per second [kWh] | 0.01167 |
| m | Instantaneous vehicle speed [mph] | 80 |
| n | Driving distance per second [mile] | 0.02222 |
| o | Instantaneous fuel efficiency per second [mile/kWh] | 1.90476 |
| p | High−speed instantaneous DTE [mile] | 148 |

FIG.4

BATTERY INFORMATION GUIDE DEVICE AND METHOD THEREFOR

CROSS-REFERENCE TO RELATED APPLICATION

The present application claims priority to Korean Patent Application No. 10-2022-0110119, filed on Aug. 31, 2022, the entire contents of which is incorporated herein for all purposes by this reference.

BACKGROUND OF THE PRESENT DISCLOSURE

Field of the Present Disclosure

The present disclosure relates to a battery information guide device and a method therefor, and more, relates to technologies of predicting a drivable distance in which a vehicle speed is reflected and providing a driver with the predicted drivable distance.

Description of Related Art

Compared to a conventional internal combustion engine vehicle, an electric vehicle has fewer charging stations and takes longer to charge. Thus, consumer interest in the distance to empty (DTE) of the electric vehicle is high. Nowadays, each of electric vehicle (original equipment manufacturers) OEMs predicts an electric vehicle DTE based on its own strategy and provides consumers with the predicted DTE.

However, because it is difficult to predict a DTE, it is difficult to provide consumers with an accurate DTE. Unlike an engine of the internal combustion engine vehicle, a motor of the electric vehicle increases energy consumption of the motor in proportion to a vehicle speed. Thus, as the vehicle speed of the electric vehicle increases, because actual fuel efficiency of the electric vehicle decreases sharply compared to official fuel efficiency, it is difficult to provide an accurate DTE when the electric vehicle travels at a high speed.

The information included in this Background of the present disclosure is only for enhancement of understanding of the general background of the present disclosure and may not be taken as an acknowledgement or any form of suggestion that this information forms the related art already known to a person skilled in the art.

BRIEF SUMMARY

Various aspects of the present disclosure are directed to providing a battery information guide device configured for notifying a driver of information related to a DTE determined based on official fuel efficiency and a method therefor.

Another aspect of the present disclosure provides a battery information guide device configured for notifying a driver of information related to a DTE determined according to a speed limit on the road, when the driver drives a vehicle at a high speed, and a method therefor.

Another aspect of the present disclosure provides a battery information guide device configured for notifying a driver of information related to a DTE determined based on a current vehicle speed of the vehicle and a method therefor.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a battery information guide device may include a display and at least one processor electrically connected to the display. The at least one processor may display information related to a first distance to empty (DTE) on the display based on official fuel efficiency and a state of charge (SOC), may receive information related to a speed limit on a road, when the at least one processor concludes that a vehicle enters the road, may display information related to a second DTE expected when the vehicle travels at the speed limit on the display, and may display information related to a third DTE determined based on an instantaneous vehicle speed of the vehicle, when a vehicle speed of the vehicle is greater than the speed limit.

In an exemplary embodiment of the present disclosure, the battery information guide device may further include a battery management system (BMS). The at least one processor is configured to determine the first DTE based on SOC information and nominal energy received from the BMS.

In an exemplary embodiment of the present disclosure, the battery information guide device may further include a navigation system. The at least one processor may receive the information related to the speed limit by the navigation system, when the at least one processor concludes that the vehicle enters the road, and may determine the second DTE based on the information related to the speed limit, an average vehicle speed in a certified highway mode, and fuel efficiency in the certified highway mode.

In an exemplary embodiment of the present disclosure, the at least one processor may display the information related to the second DTE, only when the speed limit is greater than the average vehicle speed in the certified highway mode.

In an exemplary embodiment of the present disclosure, the second DTE may be determined in proportion to the vehicle speed of the vehicle.

In an exemplary embodiment of the present disclosure, the battery information guide device may further include a BMS. The at least one processor is configured to determine an amount of battery power consumption per unit time based on battery information received from the BMS, may determine a driving distance per unit time based on the instantaneous vehicle speed of the vehicle, may determine instantaneous fuel efficiency per unit time based on the amount of battery power consumption per unit time and the driving distance per unit time, and may determine the third DTE using the instantaneous fuel efficiency per unit time.

In an exemplary embodiment of the present disclosure, the at least one processor may display the information related to the third DTE, only when the third DTE is less than the second DTE.

In an exemplary embodiment of the present disclosure, the at least one processor is configured to determine the second DTE using certified highway fuel efficiency. The certified highway fuel efficiency may differ for each country.

In an exemplary embodiment of the present disclosure, the at least one processor is configured to determine the second DTE using constant speed driving fuel efficiency map information, without using certified highway fuel efficiency.

In an exemplary embodiment of the present disclosure, the at least one processor may always display the information related to the first DTE on the display, irrespective of the vehicle speed of the vehicle.

In an exemplary embodiment of the present disclosure, the at least one processor may display the information related to the second DTE and the information related to the speed limit together, when displaying the information related to the second DTE on the display and may display the information related to the third DTE and the information related to the current vehicle speed of the vehicle together, when displaying the information related to the third DTE on the display.

According to another aspect of the present disclosure, a battery information guide method may include displaying, by at least one processor, information related to a first distance to empty (DTE) on a display based on official fuel efficiency and a state of charge (SOC), receiving, by the at least one processor, information related to a speed limit on a road, when the at least one processor concludes that a vehicle enters the road, displaying, by the at least one processor, information related to a second DTE expected when the vehicle travels at the speed limit on the display, and displaying, by the at least one processor, information related to a third DTE determined based on an instantaneous vehicle speed of the vehicle, when a vehicle speed of the vehicle is greater than the speed limit.

In an exemplary embodiment of the present disclosure, the battery information guide method may further include determining, by the at least one processor, the first DTE based on SOC information and nominal energy received from a BMS.

In an exemplary embodiment of the present disclosure, the battery information guide method may further include receiving, by the at least one processor, the information related to the speed limit by a navigation system, when the at least one processor concludes that the vehicle enters the road, and determining, by the at least one processor, the second DTE based on the information related to the speed limit, an average vehicle speed in a certified highway mode, and fuel efficiency in the certified highway mode.

In an exemplary embodiment of the present disclosure, the displaying of the information related to the second DTE on the display may include displaying, by the at least one processor, the information related to the second DTE, only when the speed limit is greater than the average vehicle speed in the certified highway mode.

In an exemplary embodiment of the present disclosure, the second DTE may be determined in proportion to the vehicle speed of the vehicle.

In an exemplary embodiment of the present disclosure, the battery information guide method may further include determining, by the at least one processor, an amount of battery power consumption per unit time based on battery information received from a BMS, determining, by the at least one processor, a driving distance per unit time based on the instantaneous vehicle speed of the vehicle, determining, by the at least one processor, instantaneous fuel efficiency per unit time based on the amount of battery power consumption per unit time and the driving distance per unit time, and determining, by the at least one processor, the third DTE using the instantaneous fuel efficiency per unit time.

In an exemplary embodiment of the present disclosure, the displaying of the information related to the third DTE on the display may include displaying, by the at least one processor, the information related to the third DTE, only when the third DTE is less than the second DTE.

In an exemplary embodiment of the present disclosure, the battery information guide method may further include determining, by the at least one processor, the second DTE using certified highway fuel efficiency. The certified highway fuel efficiency may differ for each country.

In an exemplary embodiment of the present disclosure, the battery information guide method may further include determining, by the at least one processor, the second DTE using constant speed driving fuel efficiency map information, without using certified highway fuel efficiency.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 2 is a flowchart illustrating a battery information guide method according to an exemplary embodiment of the present disclosure;

FIG. 4 illustrates an example of determining a first DTE, a second DTE, and a third DTE in a battery information guide device and a method therefor according to an exemplary embodiment of the present disclosure;

Figure 1:
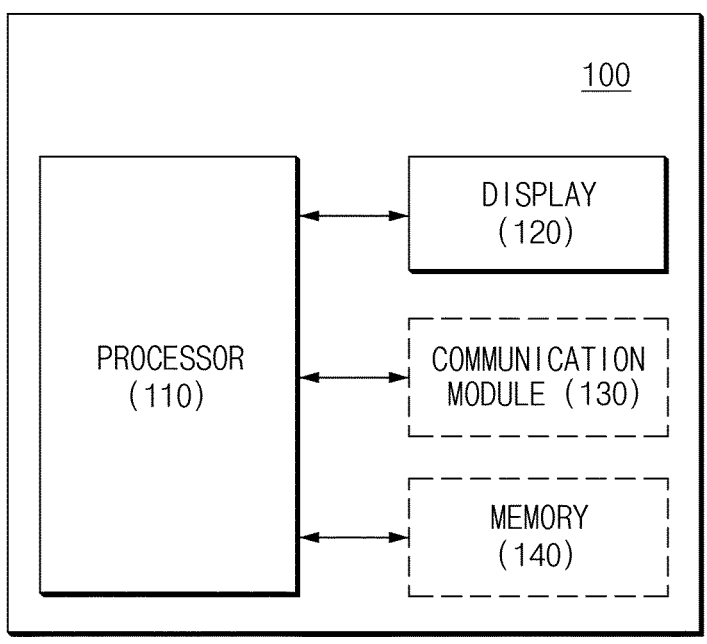
FIG. 1 is a block diagram of a battery information guide device according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In the drawings, a same reference numerals will be used throughout to designate a same or equivalent elements. Furthermore, a detailed description of well-known features or functions will be ruled out in order not to unnecessarily obscure the gist of the present disclosure.

In describing the components of the exemplary embodiment of the present disclosure, terms such as first, second, "A", "B", (a), (b), and the like may be used. These terms are only used to distinguish one element from another element, but do not limit the corresponding elements irrespective of the order or priority of the corresponding elements. Furthermore, unless otherwise defined, all terms including technical and scientific terms used herein are to be interpreted as is customary in the art to which the present disclosure belongs. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, various embodiments of the present disclosure will be described in detail with reference to FIGS. 1 to 6.

FIG. 1 is a block diagram of a battery information guide device 100 according to an exemplary embodiment of the present disclosure.

Referring to FIG. 1, the battery information guide device 100 according to various exemplary embodiments of the present disclosure may include a processor 110, a display 120, a communication module 130, and a memory 140. In various exemplary embodiments of the present disclosure, the battery information guide device 100 may include an additional component other than the components shown in FIG. 1, or may omit at least one of the components shown in FIG. 1.

Hereinafter, a car or a vehicle described in an exemplary embodiment of the present disclosure refers to an electric vehicle (EV), but the description of the car or the vehicle does not exclude cars or vehicles which perform various types of charging other than a plug-in hybrid electric vehicle (PHEV) and a fuel cell electric vehicle (FCEV).

The processor 110 may include, for example, an electronic control unit (ECU), a micro controller unit (MCU), or another sub-controller, which is loaded into the vehicle.

The processor 110 may include, for example, a vehicle control unit (VCU) which has official fuel efficiency information and determines necessary information.

According to an exemplary embodiment of the present disclosure, the processor 110 may execute determination and data processing about control and/or communication of at least one other component of the battery information guide device 100 using instructions stored in the memory 140.

According to an exemplary embodiment of the present disclosure, the processor 110 may control at least one object displayed on the display 120. In detail, the processor 110 may control DTE information displayed on the display 120.

According to an exemplary embodiment of the present disclosure, the display 120 may include at least one of a liquid crystal display (LCD), a thin film transistor-liquid crystal display (TFT-LCD), an organic light-emitting diode (OLED) display, a flexible display, a three-dimensional (3D) display, a transparent display, a head-up display (HUD), a touch screen, a cluster, or a combination thereof.

According to an exemplary embodiment of the present disclosure, the display 120 may be implemented as a touch screen coupled to a touch sensor to be used as an input device. For example, a touch film, a touch pad, or the like may be used as the touch sensor.

According to an exemplary embodiment of the present disclosure, the communication module 130 may receive information received from various sensors or systems to collect state information of the vehicle or driving information of the vehicle.

Herein, the communication module 130 may include a communication module which supports vehicle network communication such as controller area network (CAN) communication, Local Interconnect Network (LIN) communication, and/or flex-ray communication.

According to an exemplary embodiment of the present disclosure, the memory 140 may store data, an algorithm, and/or the like necessary for an operation of the battery information guide device 100.

According to an exemplary embodiment of the present disclosure, the memory 140 may store information received from various sensors or systems to collect state information of the vehicle or driving information of the vehicle.

For example, the memory 140 may store information received from at least one vehicle management system and/or at least one vehicle control system, such as a battery management system (BMS), a navigation system, or a vehicle control unit (VCU).

Herein, the memory 140 may include a storage medium such as a random access memory (RAM), a static RAM (SRAM), a read-only memory (ROM), a programmable ROM (PROM), and/or an electrically erasable PROM (EE-PROM).

FIG. 2 is a flowchart illustrating a battery information guide method according to an exemplary embodiment of the present disclosure.

Operations in S210 to S240 in an exemplary embodiment below may be sequentially performed, but are not necessarily sequentially performed. For example, an order of the respective operations may be changed, and at least two operations may be performed in parallel.

Referring to FIG. 2, in the battery information guide device and the method therefor according to an exemplary embodiment of the present disclosure, in S210, a processor may display information related to a first DTE on a display based on official fuel efficiency and a state of charge (SOC).

According to an exemplary embodiment of the present disclosure, the processor is configured to determine the first DTE based on the official fuel efficiency and the SOC (or a current SOC). In in an exemplary embodiment of the present disclosure, the first DTE may be referred to as a "reference DTE".

According to an exemplary embodiment of the present disclosure, the processor may receive information related to a current SOC from a battery management system (BMS) through a communication module.

According to an exemplary embodiment of the present disclosure, the processor is configured to determine the first DTE based on the information related to the current SOC and nominal energy of the vehicle. In detail, a VCU may determine the first DTE based on the information related to the current SOC and the nominal energy of the vehicle.

According to an exemplary embodiment of the present disclosure, the processor is configured to determine the first DTE using Equation 1 below.

$$d = a \times \left( \frac{b}{100 \times c} \right)$$ [Equation 1]

In Equation 1 above, a refers to the official fuel efficiency. b refers to the current SOC [%], and c refers to the nominal energy [kWh]. d refers to the first DTE [km].

According to an exemplary embodiment of the present disclosure, the processor may display the determined first DTE on the display.

According to an exemplary embodiment of the present disclosure, the processor may always display the first DTE on the display, irrespective of a vehicle speed of the vehicle.

According to an exemplary embodiment of the present disclosure, in S220, when it is determined that the vehicle enters the road, the processor may receive information related to a speed limit on the road.

According to an exemplary embodiment of the present disclosure, the processor may obtain state information of the vehicle, driving information of the vehicle, or environmental information around the vehicle from various sensors or systems through the communication module.

According to an exemplary embodiment of the present disclosure, the processor is configured to determine whether the vehicle enters a road (e.g., a highway) based on the state information of the vehicle, the driving information of the vehicle, or the environmental information around the vehicle.

According to an exemplary embodiment of the present disclosure, when it is determined that the vehicle enters the road, the processor may obtain (or receive) information related to a speed limit on the road the vehicle enters by a navigation system.

According to an exemplary embodiment of the present disclosure, in S230, the processor may display information related to a second DTE expected when the vehicle travels at the speed limit on the display.

According to an exemplary embodiment of the present disclosure, the processor is configured to determine the second DTE based on the information related to the speed limit, an average vehicle speed in a certified highway mode, and fuel efficiency in the certified highway mode. In in an exemplary embodiment of the present disclosure, the second DTE may be referred to as a "high-speed limit DTE".

According to an exemplary embodiment of the present disclosure, a unit of a vehicle speed in the information related to the speed limit may differ per area.

According to an exemplary embodiment of the present disclosure, a test method used when official fuel efficiency of an electric vehicle is certified may include a mode for simulating city driving and a mode for simulating highway driving.

According to an exemplary embodiment of the present disclosure, the processor may receive an average vehicle speed and fuel efficiency information in the highway mode of the test method used upon the certification.

In an exemplary embodiment of the present disclosure, the average vehicle speed in the highway mode of the test method used upon the certification may be referred to as a certified highway mode average vehicle speed or an average vehicle speed in the certified highway mode.

Furthermore, the fuel efficiency information in the highway mode of the test method used upon the certification may be referred to as certificated highway fuel efficiency, certified highway mode fuel efficiency, or fuel efficiency in a certified highway mode.

According to an exemplary embodiment of the present disclosure, the average vehicle speed in the certified highway mode may differ per country.

For example, an average vehicle speed in an MCT highway mode of a fuel efficiency certification test method in Korea, the United States, or the like may be 77.6 km/h.

Furthermore, for example, an average vehicle speed in a WLTP highway mode of a fuel efficiency certification test method in Europe or the like may be 70.0 km/h.

Furthermore, for example, an average vehicle speed in an NEDC highway mode of a fuel efficiency certification test method in Europe before 2017 and a current fuel efficiency certification test method in some areas such as Russia may be 63.4 km/h.

According to an exemplary embodiment of the present disclosure, the processor is configured to determine the second DTE using Equation 2 below.

$$h = g \times \left( \frac{f}{e} \right) \times \left( \frac{b}{100 \times c} \right)$$ [Equation 2]

In Equation 2 above, b refers to the current SOC [%], and c refers to the nominal energy [kWh]. e refers to the speed limit on the road [km/h], f refers to the certified highway mode average speed [km/h], and g refers to the highway mode fuel efficiency of each test method [km/kWh]. h refers to the second DTE [km].

According to another exemplary embodiment of the present disclosure, the processor is configured to determine the second DTE using constant speed driving fuel economy map information, without using certified highway fuel efficiency.

According to an exemplary embodiment of the present disclosure, the constant speed driving fuel efficiency map information may be obtained by a constant speed driving fuel efficiency test. The constant speed driving fuel efficiency test may be executed by a predetermined test method according to a test entity (e.g., a company).

According to an exemplary embodiment of the present disclosure, the constant speed driving fuel efficiency map information may include data about fuel efficiency determined by measuring the fuel amount while maintaining the vehicle speed of the vehicle at a specified speed.

According to an exemplary embodiment of the present disclosure, the processor is configured to determine the second DTE in proportion to the vehicle speed of the vehicle.

According to an exemplary embodiment of the present disclosure, the processor may display the determined second DTE on the display.

According to an exemplary embodiment of the present disclosure, only when the speed limit on the road is greater than the average vehicle speed in the certified highway mode, the processor may display the information related to the second DTE on the display.

According to an exemplary embodiment of the present disclosure, in S240, when the vehicle speed of the vehicle is greater than the speed limit, the processor may display information related to a third DTE determined based on an instantaneous vehicle speed of the vehicle on the display.

According to an exemplary embodiment of the present disclosure, the processor is configured to determine the third second DTE based on the instantaneous vehicle speed of the vehicle. In in an exemplary embodiment of the present disclosure, the third DTE may be referred to as a "high-speed instantaneous DTE".

According to an exemplary embodiment of the present disclosure, the processor is configured to determine the case where the vehicle speed of the vehicle is greater than the speed limit.

According to an exemplary embodiment of the present disclosure, the processor may receive a high voltage battery voltage and current consumption value per unit time from the BMS through the communication module.

According to an exemplary embodiment of the present disclosure, the processor may receive a high voltage battery voltage and current consumption value at intervals of one second from the BMS through the communication module.

According to an exemplary embodiment of the present disclosure, the processor is configured to determine instantaneous high voltage battery power consumption based on the data received from the BMS.

According to an exemplary embodiment of the present disclosure, the processor is configured to determine the instantaneous high voltage battery power consumption using Equation 3 below.

$$k = i \times j \qquad \text{[Equation 3]}$$

In Equation 3 above, i refers to the instantaneous high voltage battery voltage [V], and j refers to instantaneous high voltage battery current consumption [A]. k refers to the instantaneous high voltage battery power consumption [W].

According to an exemplary embodiment of the present disclosure, the processor is configured to determine the amount of high voltage battery power consumption per second using Equation 4 below.

$$1 = k \times \frac{1}{3600000} \qquad \text{[Equation 4]}$$

In Equation 4 above, k refers to the instantaneous high voltage battery power consumption [W], and I refers to the amount of high voltage battery power consumption per second [kWh].

According to an exemplary embodiment of the present disclosure, the processor is configured to determine a driving distance per second based on the instantaneous vehicle speed of the vehicle.

According to an exemplary embodiment of the present disclosure, the processor is configured to determine the driving distance per second using Equation 5 below.

$$n = \frac{m}{3600} \qquad \text{[Equation 5]}$$

In Equation 5 above, m refers to the instantaneous vehicle speed, and n refers to the driving distance per second [km].

According to an exemplary embodiment of the present disclosure, the processor is configured to determine the instantaneous fuel efficiency per second of the vehicle and the third DTE.

According to an exemplary embodiment of the present disclosure, the processor is configured to determine the instantaneous fuel efficiency per second using Equation 6 below.

$$o = \frac{n}{l} \qquad \text{[Equation 6]}$$

In Equation 6 above, I refers to the amount of the high voltage battery power consumption per second [kWh], and n refers to the driving distance per second [km]. o refers to the instantaneous fuel efficiency per second [km/kWh].

According to an exemplary embodiment of the present disclosure, the processor is configured to determine the third DTE using Equation 7 below.

$$p = o \times \left( \frac{b}{100 \times c} \right) \qquad \text{[Equation 7]}$$

In Equation 7 above, b refers to the current SOC [%], and c refers to the nominal energy [kWh]. o refers to the instantaneous fuel efficiency per second [km/kWh]. p refers to the third DTE [km].

According to an exemplary embodiment of the present disclosure, the processor may display the determined third DTE on the display.

According to an exemplary embodiment of the present disclosure, only when the third DTE is less than the second DTE, the processor may display the information related to the third DTE on the display.

Figure 3:
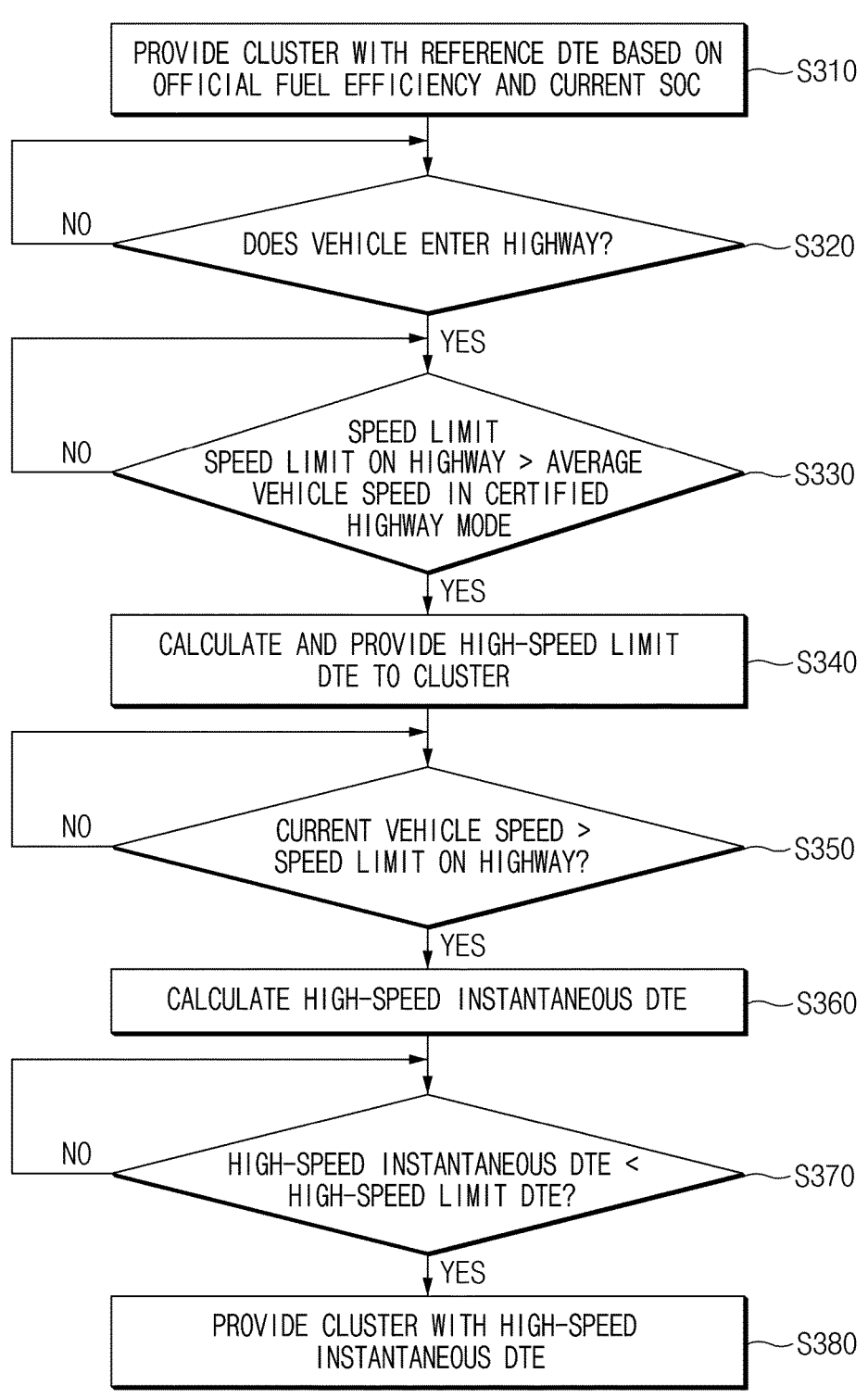
FIG. 3 is a flowchart illustrating determining a DTE based in a state of a vehicle in a battery information guide device and a method therefor according to an exemplary embodiment of the present disclosure.

FIG. 3 is a flowchart illustrating determining a DTE based in a state of a vehicle in a battery information guide device and a method therefor according to an exemplary embodiment of the present disclosure.

Operations in S310 to S380 in an exemplary embodiment below may be sequentially performed, but are not necessarily sequentially performed. For example, an order of the respective operations may be changed, and at least two operations may be performed in parallel.

Contents, which correspond to or are duplicated with the contents described above in conjunction with contents of FIG. 3, may be briefly described or omitted.

Referring to FIG. 3, in the battery information guide device and the method therefor according to an exemplary embodiment of the present disclosure, in S310, a processor may provide a cluster with a reference DTE based on official fuel efficiency and a current SOC.

According to an exemplary embodiment of the present disclosure, the processor is configured to determine the reference DTE based on SOC information and nominal energy, which are received from a BMS.

According to an exemplary embodiment of the present disclosure, the processor may provide the determined reference DTE by the cluster provided in a vehicle.

According to an exemplary embodiment of the present disclosure, the processor may always provide information related to the reference DTE by the cluster, irrespective of a vehicle speed of the vehicle.

According to an exemplary embodiment of the present disclosure, in S320, the processor is configured to determine whether the vehicle enters a highway.

According to an exemplary embodiment of the present disclosure, the processor is configured to determine whether the vehicle enters the highway based on state information of the vehicle, driving information of the vehicle, or environmental information around the vehicle.

According to an exemplary embodiment of the present disclosure, when it is determined that the vehicle does not enter the highway, the processor may return to S310.

According to an exemplary embodiment of the present disclosure, when it is determined that the vehicle enters the highway, in S330, the processor is configured to determine whether the speed limit on the highway is greater than an average vehicle speed in a certified highway mode.

According to an exemplary embodiment of the present disclosure, when it is determined that the vehicle enters the highway, the processor may receive information related to the speed limit on the highway by a navigation system.

According to an exemplary embodiment of the present disclosure, the processor is configured to determine whether the speed limit on the highway is greater than the average speed in the certified highway mode.

According to an exemplary embodiment of the present disclosure, when it is determined that the speed limit on the highway is not greater than the average vehicle speed in the certified highway mode, the processor may return to S320.

According to an exemplary embodiment of the present disclosure, when it is determined that the speed limit on the highway is greater than the average vehicle speed in the certified highway mode, in S340, the processor is configured to determine and provide a high-speed limit DTE to the cluster.

According to an exemplary embodiment of the present disclosure, the processor is configured to determine the high-speed limit DTE based on information related to the speed limit, the average vehicle speed in the certified highway mode, and fuel efficiency in the certified highway mode.

According to an exemplary embodiment of the present disclosure, when it is determined that the speed limit on the highway is greater than the average vehicle speed in the certified highway mode, the processor may provide the determined high-speed limit DTE by the cluster.

According to an exemplary embodiment of the present disclosure, in S350, the processor is configured to determine whether a current vehicle speed of the vehicle is greater than the speed limit on the highway.

According to an exemplary embodiment of the present disclosure, the processor is configured to determine whether the current vehicle speed of the vehicle is greater than the speed limit on the highway, based on the driving information of the vehicle.

According to an exemplary embodiment of the present disclosure, when it is determined that the current vehicle speed of the vehicle is not greater than the speed limit on the highway, the processor may return to S340.

According to an exemplary embodiment of the present disclosure, when it is determined that the current vehicle speed of the vehicle is greater than the speed limit on the highway, in S360, the processor is configured to determine a high-speed instantaneous DTE.

According to an exemplary embodiment of the present disclosure, the processor is configured to determine an amount of battery power consumption per unit time (e.g., one second) based on battery information received from the BMS.

According to an exemplary embodiment of the present disclosure, the processor is configured to determine a driving distance per unit time based on an instantaneous vehicle speed of the vehicle.

According to an exemplary embodiment of the present disclosure, the processor is configured to determine instantaneous fuel efficiency per unit time based on the amount of battery power consumption per unit time and the driving distance per unit time.

According to an exemplary embodiment of the present disclosure, the processor is configured to determine a high-speed instantaneous DTE using the instantaneous fuel efficiency per unit time.

According to an exemplary embodiment of the present disclosure, in S370, the processor is configured to determine whether the high-speed instantaneous DTE is less than the high-speed limit DTE.

According to an exemplary embodiment of the present disclosure, the processor is configured to determine whether the high-speed instantaneous DTE is less than the high-speed limit DTE, based on the determined result.

According to an exemplary embodiment of the present disclosure, when it is determined that the high-speed instantaneous DTE is not less than the high-speed limit DTE, the processor may return to S360.

According to an exemplary embodiment of the present disclosure, when it is determined that the high-speed instantaneous DTE is less than the high-speed limit DTE, in S380, the processor may provide the cluster with the high-speed instantaneous DTE.

According to an exemplary embodiment of the present disclosure, the processor may provide the high-speed instantaneous DTE by the cluster, only when the high-speed instantaneous DTE is less than the high-speed limit DTE, based on the determined result.

FIG. 4 illustrates an example of determining a first DTE, a second DTE, and a third DTE in a battery information guide device and a method therefor according to an exemplary embodiment of the present disclosure. Hereinafter, the first DTE, the second DTE, and the third DTE may be referred to as a reference DTE, a high-speed limit DTE, and a high-speed instantaneous DTE, respectively.

According to an exemplary embodiment of the present disclosure, when a vehicle with a current SOC value of 100% travels at a vehicle speed of 80 mph on a road with a speed limit of 65 mph, a processor is configured to determine the reference DTE, the high-speed limit DTE, and the high-speed instantaneous DTE.

According to an exemplary embodiment of the present disclosure, the processor is configured to determine the reference DTE (e.g., 303 [mile]) using official fuel efficiency (e.g., 3.9 [mile/kWh]), a current SOC value of a high voltage battery (e.g., 100 [%]), and nominal energy of the high voltage battery (e.g., 77.8 [kWh]).

According to an exemplary embodiment of the present disclosure, the processor is configured to determine the high-speed limit DTE (e.g., 190 [mile]) using a speed limit on the road (e.g., 65 [mph]), an average vehicle speed in a North American certification test highway mode (e.g., 48.2 [mph])), and fuel efficiency in the North American certification test highway mode (e.g., 3.3 [mile/kWh]).

According to an exemplary embodiment of the present disclosure, the processor is configured to determine the high-speed instantaneous DTE (e.g., 148 [mile]) using an instantaneous high voltage battery voltage (e.g., 700 [V]), instantaneous high voltage battery current consumption (e.g., 60 [A]), instantaneous high voltage battery power consumption (e.g., 42000 [W]), the amount of high voltage battery power consumption per second (e.g., 0.01167 [kWh]), an instantaneous vehicle speed (e.g., 80 [mph]), a driving distance per second (e.g., 0.02222 [mile]), and instantaneous fuel efficiency per second (e.g., 1.90476 [mile/kWh]).

Figure 5:
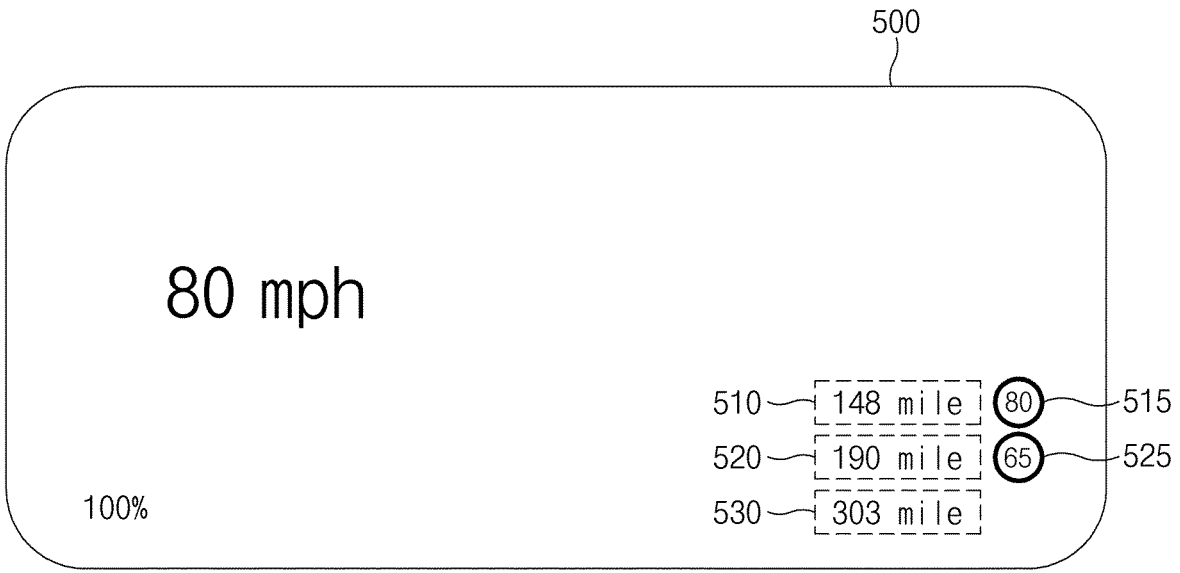
FIG. 5 illustrates notifying a driver of at least one of first DTE information, second DTE information, third DTE information, or a combination thereof in a battery information guide device and a method therefor according to an exemplary embodiment of the present disclosure.

FIG. 5 illustrates notifying a driver of at least one of first DTE information, second DTE information, third DTE information, or a combination thereof in a battery information guide device and a method therefor according to an exemplary embodiment of the present disclosure. Hereinafter, a first DTE, a second DTE, and a third DTE may be referred to as a reference DTE, a high-speed limit DTE, and a high-speed instantaneous DTE, respectively.

According to an exemplary embodiment of the present disclosure, when a vehicle with a current SOC value of 100% travels at a vehicle speed of 80 mph on a road with a speed limit of 65 mph, a processor may provide at least one of the reference DTE, the high-speed limit DTE, the high-speed instantaneous DTE, or a combination thereof by a cluster 500.

According to an exemplary embodiment of the present disclosure, the processor may provide a reference DTE 530 determined based on official fuel efficiency and an SOC by the cluster 500.

According to an exemplary embodiment of the present disclosure, the processor may always display the reference DTE 530 on the cluster 500, irrespective of a vehicle speed of the vehicle.

According to an exemplary embodiment of the present disclosure, the processor may provide a high-speed limit DTE 520 expected when the vehicle travels at a speed limit on the road by the cluster 500.

According to an exemplary embodiment of the present disclosure, when the vehicle speed of the vehicle is greater than the speed limit on the road, the processor may provide a high-speed instantaneous DTE 510 determined based on an instantaneous vehicle speed of the vehicle by the cluster 500.

According to an exemplary embodiment of the present disclosure, the processor may display the high-speed instantaneous DTE 510 on the cluster 500, only when the high-speed instantaneous DTE 510 is less than the high-speed limit DTE 520.

According to an exemplary embodiment of the present disclosure, when displaying the high-speed limit DTE 520 on the cluster 500, the processor may display information related to the high-speed limit DTE 520 and speed limit information 525 together.

According to an exemplary embodiment of the present disclosure, when displaying the high-speed instantaneous DTE 510 on the cluster 500, the processor may display the high-speed instantaneous DTE 510 and current vehicle speed information 515 of the vehicle together.

Figure 6:
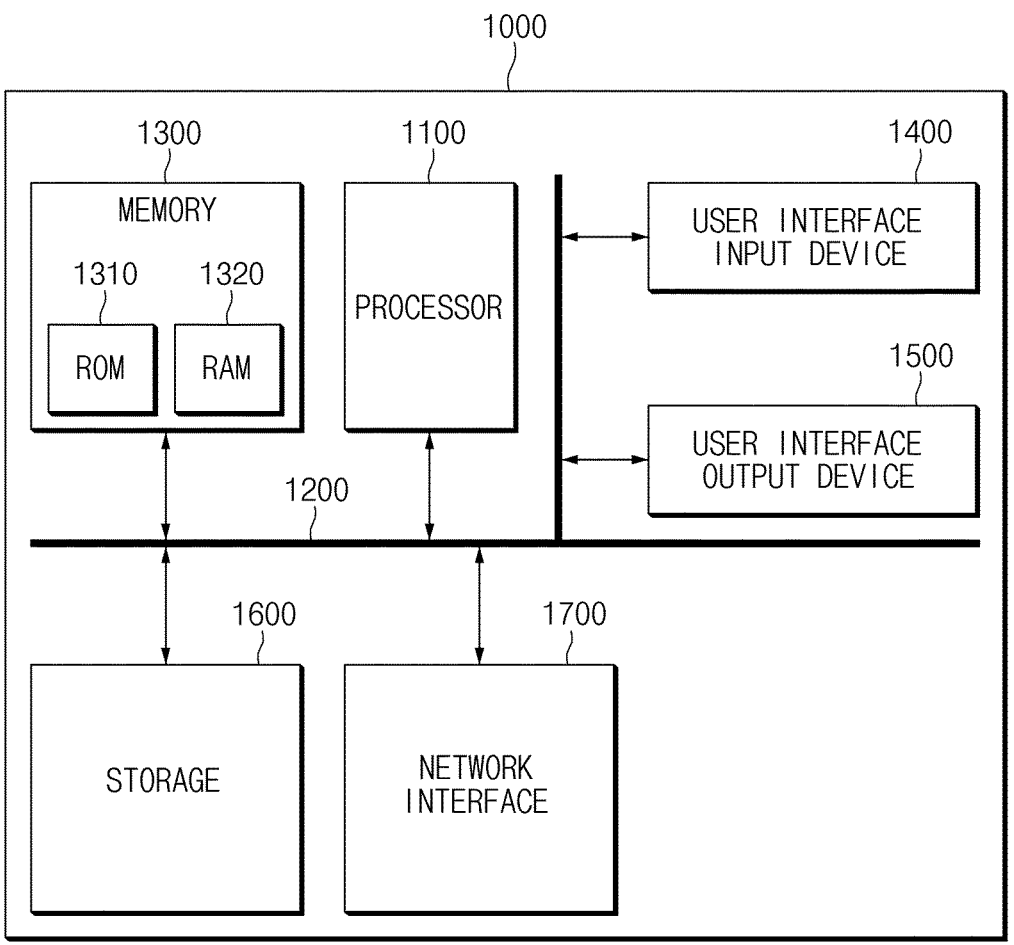
FIG. 6 illustrates a computing system about a battery information guide device and a method therefor according to an exemplary embodiment of the present disclosure.

FIG. 6 illustrates a determining system about a battery information guide device and a method therefor according to an exemplary embodiment of the present disclosure.

Referring to FIG. 6, a determining system 1000 about the battery information guide device and the method therefor may include at least one processor 1100, a memory 1300, a user interface input device 1400, a user interface output device 1500, storage 1600, and a network interface 1700, which are connected to each other via a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a Read-Only Memory (ROM) 1310 and a Random Access Memory (RAM) 1320.

Accordingly, the operations of the method or algorithm described in connection with the exemplary embodiments included in the specification may be directly implemented with a hardware module, a software module, or a combination of the hardware module and the software module, which is executed by the processor 1100. The software module may reside on a storage medium (that is, the memory 1300 and/or the storage 1600) such as a RAM, a flash memory, a ROM, an EPROM, an EEPROM, a register, a hard disc, a removable disk, and a CD-ROM.

The exemplary storage medium may be coupled to the processor 1100. The processor 1100 may read out information from the storage medium and may write information in the storage medium. Alternatively, the storage medium may be integrated with the processor 1100. The processor and the storage medium may reside in an application specific integrated circuit (ASIC). The ASIC may reside within a user terminal. In another case, the processor and the non-transitory storage medium may reside in the user terminal as separate components.

A description will be provided of effects of the battery information guide device and the method therefor according to an exemplary embodiment of the present disclosure.

According to at least one of embodiments of the present disclosure, the battery information guide device may improve the convenience of a driver by providing accurate DTE information according to a situation.

According to at least one of embodiments of the present disclosure, the battery information guide device may improve a brand image and marketability according to quality improvement.

Furthermore, various effects ascertained directly or indirectly through the present disclosure may be provided.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:
1. A battery information guide apparatus, comprising:
a display; and
at least one processor electrically connected to the display,
wherein the at least one processor is configured to:
displays information related to a first distance to empty (DTE) on the display based on official fuel efficiency and a state of charge (SOC), receives information related to a speed limit on a road, based on whether that the at least one processor concludes that a vehicle enters the road, determines whether a vehicle speed of the vehicle is greater than the speed limit, displays information related to a second DTE based on that the vehicle speed of the vehicle is equal to or less than the speed limit, on the display, displays information related to a third DTE based on that the vehicle speed of the vehicle is greater than the speed limit, and wherein the second DTE is determined based on an average vehicle speed in a certified highway mode and the third DTE is determined based on an instantaneous vehicle speed of the vehicle.

2. The battery information guide apparatus of claim 1, further including:

a battery management system (BMS), wherein the at least one processor is configured to determine the first DTE based on SOC information and nominal energy received from the BMS.

3. The battery information guide apparatus of claim 1, further including:

a navigation system, wherein the at least one processor is configured to receive the information related to the speed limit by the navigation system, when the at least one processor concludes that the vehicle enters the road, and to determine the second DTE based on the information related to the speed limit, the average vehicle speed in the certified highway mode, and fuel efficiency in the certified highway mode.

4. The battery information guide apparatus of claim 3, wherein the at least one processor is configured to display the information related to the second DTE, only when the speed limit is greater than the average vehicle speed in the certified highway mode.

5. The battery information guide apparatus of claim 3, wherein the second DTE is determined in proportion to the vehicle speed of the vehicle.

6. The battery information guide apparatus of claim 1, further including:

a BMS, wherein the at least one processor is configured to determine an amount of battery power consumption per unit time based on battery information received from the BMS, determine a driving distance per unit time based on the instantaneous vehicle speed of the vehicle, determine instantaneous fuel efficiency per unit time based on the amount of battery power consumption per unit time and the driving distance per unit time, wherein the third DTE is additionally determined by using the instantaneous fuel efficiency per unit time.

7. The battery information guide apparatus of claim 1, wherein the at least one processor is configured to display the information related to the third DTE, only when the third DTE is less than the second DTE.

8. The battery information guide apparatus of claim 1, wherein the at least one processor is configured to determine the second DTE using certified highway fuel efficiency, and wherein the certified highway fuel efficiency differs for each country.

9. The battery information guide apparatus of claim 1, wherein the at least one processor is configured to determine the second DTE using constant speed driving fuel efficiency map information, without using certified highway fuel efficiency.

10. The battery information guide apparatus of claim 1, wherein the at least one processor is configured to continuously display the information related to the first DTE on the display, irrespective of the vehicle speed of the vehicle.

11. The battery information guide apparatus of claim 1, wherein the at least one processor is configured to display the information related to the second DTE and the information related to the speed limit together, when displaying the information related to the second DTE on the display and to display the information related to the third DTE and the information related to a current vehicle speed of the vehicle together, when displaying the information related to the third DTE on the display.

12. A battery information guide method, comprising:

displaying, by at least one processor, information related to a first distance to empty (DTE) on a display based on official fuel efficiency and a state of charge (SOC);

receiving, by the at least one processor, information related to a speed limit on a road, based on that the at least one processor concludes that a vehicle enters the road;

determining, by the at least one processor, vehicle speed of the vehicle is greater than the speed limit;

displaying, by the at least one processor, information related to a second DTE based on a that the vehicle speed of the vehicle is equal to or less than the speed limit, on the display;

displaying, by the at least one processor, information related to a third DTE based on whether that the vehicle speed of the vehicle is greater than the speed limit, and wherein the second DTE is determined based on an average vehicle speed in a certified highway mode and the third DTE is determined based on an instantaneous vehicle speed of the vehicle.

13. The battery information guide method of claim 12, further including:

determining, by the at least one processor, the first DTE based on SOC information and nominal energy received from a battery management system (BMS).

14. The battery information guide method of claim 12, further including:

receiving, by the at least one processor, the information related to the speed limit by a navigation system, when the at least one processor concludes that the vehicle enters the road; and determining, by the at least one processor, the second DTE based on the information related to the speed limit, the average vehicle speed in the certified highway mode, and fuel efficiency in the certified highway mode.

15. The battery information guide method of claim 14, wherein the displaying of the information related to the second DTE on the display includes:

displaying, by the at least one processor, the information related to the second DTE, only when the speed limit is greater than the average vehicle speed in the certified highway mode.

16. The battery information guide method of claim 14, wherein the second DTE is determined in proportion to the vehicle speed of the vehicle.

17. The battery information guide method of claim 12, further including:

determining, by the at least one processor, an amount of battery power consumption per unit time based on battery information received from a BMS;

determining, by the at least one processor, a driving distance per unit time based on the instantaneous vehicle speed of the vehicle;

determining, by the at least one processor, instantaneous fuel efficiency per unit time based on the amount of battery power consumption per unit time and the driving distance per unit time; and determining, by the at least one processor, the third DTE additionally using the instantaneous fuel efficiency per unit time.

18. The battery information guide method of claim 12, wherein the displaying of the information related to the third DTE on the display includes:

displaying, by the at least one processor, the information related to the third DTE, only when the third DTE is less than the second DTE.

19. The battery information guide method of claim 12, further including:

determining, by the at least one processor, the second DTE using certified highway fuel efficiency, wherein the certified highway fuel efficiency differs for each country.

20. The battery information guide method of claim 12, further including:

determining, by the at least one processor, the second DTE using constant speed driving fuel efficiency map information, without using certified highway fuel efficiency.

* * * * *